(12) United States Patent
Anthony et al.

(10) Patent No.: US 8,269,657 B2
(45) Date of Patent: Sep. 18, 2012

(54) BACKGROUND CALIBRATION OF OFFSETS IN INTERLEAVED ANALOG TO DIGITAL CONVERTERS

(75) Inventors: Michael P. Anthony, Andover, MA (US); Gerhard Sollner, Winchester, MA (US); Lawrence J. Kushner, Andover, MA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/818,762

(22) Filed: Jun. 18, 2010
(Under 37 CFR 1.47)

(65) Prior Publication Data
US 2011/0102228 A1    May 5, 2011

Related U.S. Application Data

(60) Provisional application No. 61/226,977, filed on Jul. 20, 2009, provisional application No. 61/220,861, filed on Jun. 26, 2009.

(51) Int. Cl.
*H03M 1/06* (2006.01)
(52) U.S. Cl. .......................... 341/118; 341/120; 341/155
(58) Field of Classification Search .................. 341/118, 341/155
See application file for complete search history.

(56) References Cited

U.S. PATENT DOCUMENTS

| | | | |
|---|---|---|---|
| 4,763,105 A | 8/1988 | Jenq | |
| 6,377,195 B1 | 4/2002 | Eklund et al. | |
| 6,982,664 B1 * | 1/2006 | Nairn | 341/118 |
| 7,161,514 B2 * | 1/2007 | Tamba | 341/120 |
| 7,227,479 B1 | 6/2007 | Chen et al. | |
| 7,301,486 B2 * | 11/2007 | Wang et al. | 341/118 |
| 7,808,408 B2 * | 10/2010 | Madisetti et al. | 341/118 |

* cited by examiner

*Primary Examiner* — Khai M Nguyen
(74) *Attorney, Agent, or Firm* — Cesari and McKenna, LLP

(57) ABSTRACT

A multi-channel time interleaved ADC (TIADC) provides for offset estimation and correction. The correction is accomplished through analog adjustment of offset rather than by digital correction of their outputs. In certain aspects, polarity reversal circuits may be used to further improve performance.

22 Claims, 4 Drawing Sheets

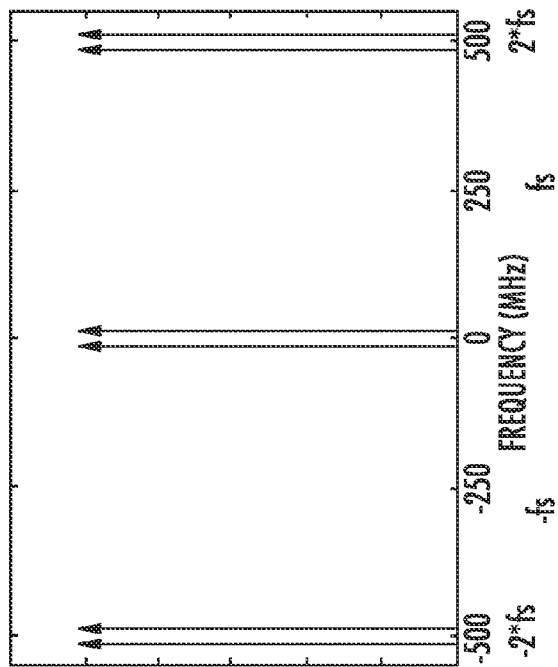
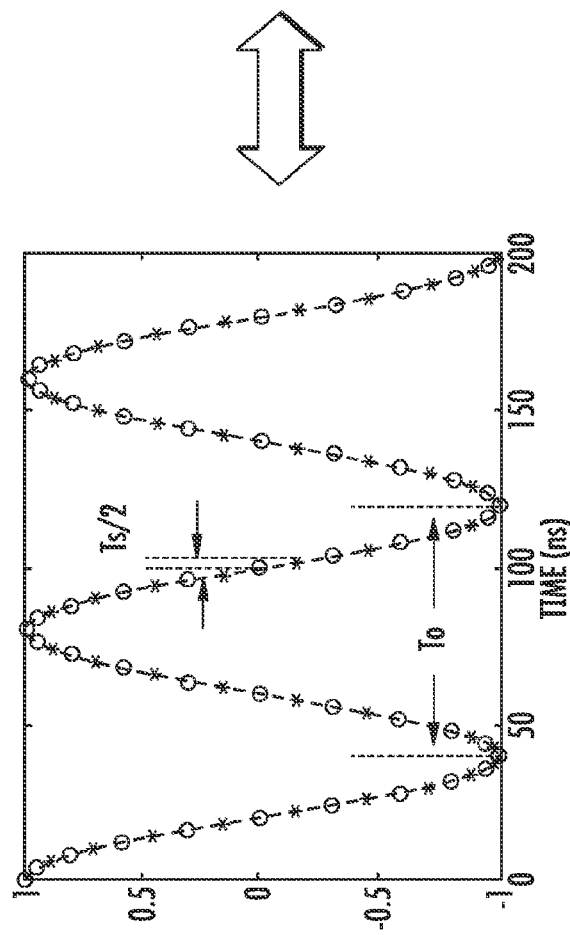
FIG. 2B
FIG. 2A

BACKGROUND CALIBRATION OF OFFSETS IN INTERLEAVED ANALOG TO DIGITAL CONVERTERS

RELATED APPLICATIONS

This application claims the benefit of U.S. Provisional Application No. 61/226,977, filed on Jul. 20, 2009 and U.S. Provisional Application No. 61/220,861, filed on Jun. 26, 2009. The entire teachings of the above applications are incorporated herein by reference.

BACKGROUND OF THE INVENTION

It is sometimes desirable to digitize analog signals at higher speed than, but with nearly the same accuracy as, can be obtained from a single analog-to-digital converter (ADC). One approach is to operate a number, N, of individual M-bit ADCs so that they sequentially sample the same analog input signal. We will call these individual M-bit ADCs the "subADCs."=Suppose each subADC samples at a frequency, fs, and that the samples of the N subADCs are equally spaced apart by a time equal to 1/(N*fs). Then, if the M-bit digital outputs of the N subADCs are interleaved together properly, the input signal is also properly sampled, with the samples converted to digital values at a combined sample rate of Fs=N*fs. In this way a higher equivalent sampling rate can be obtained with nearly M-bit accuracy.

One difficulty with this approach is that the components and operating conditions of the individual subADCs will not be identical. Such differences can lead to spurious energy in the output digital data that is not present in the input analog signal. In the case of two subADCs, each operating at sample rate of fs, a difference in Direct Current (DC) offset between the two sub ADCs will produce a square wave at an output frequency of fs/2, with an amplitude equal to the magnitude of the difference in the offset (i.e., a spurious tone will appear at fs/2).

In certain prior art systems of this type, the offset can be measured at the output of the subADCs, and corrected by a digital adjustment to the digital output samples.

Another approach to reduce the effect of offset is described in U.S. Pat. No. 6,377,195 issued to Eklund, et al. The approach described there is to randomly switch, or "chop" the polarity of the analog input to each subADC before it is sampled and digitized. This polarity-switching process produces an input analog signal with zero mean. The polarity of each sample is then switched back to its original polarity, or "reverse chopped".

SUMMARY OF THE DISCLOSURE

While these prior approaches can help remove DC offset, at least one difficulty remains. That is, the offset error can only be removed to the accuracy of the subADCs. The offset may be known arbitrarily well, but consider that the subADC outputs are digital words of finite resolution, say M binary bits. Thus, the offset correction can only be made to the accuracy of the least significant bit. This results in additional noise in the output data stream, although it is spread out in frequency because of the random sign modulation.

The subject of this disclosure is therefore to provide ways to minimize the effect of the individual subADCs in introducing different offsets. In one embodiment, a two-(or more) channel Time Interleaved ADC (TIADC) is provided wherein the DC offset for each subADC is estimated and corrected. Unlike prior approaches, the offset correction for each subADC is accomplished through analog adjustments to the input signals, rather than by digital correction of the output signals.

In accordance with further details, the input signals to each subADC may be pseudo-randomly switched or "chopped" in polarity. The polarity is then switched back to the original polarity at the output of the subADCs.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 2A and 2B illustrate a sampled input signal and the frequency domain to result when there is no offset in subADCs.

DETAILED DESCRIPTION OF PREFERRED EMBODIMENTS

A description of example embodiments follows.

Figure 1:
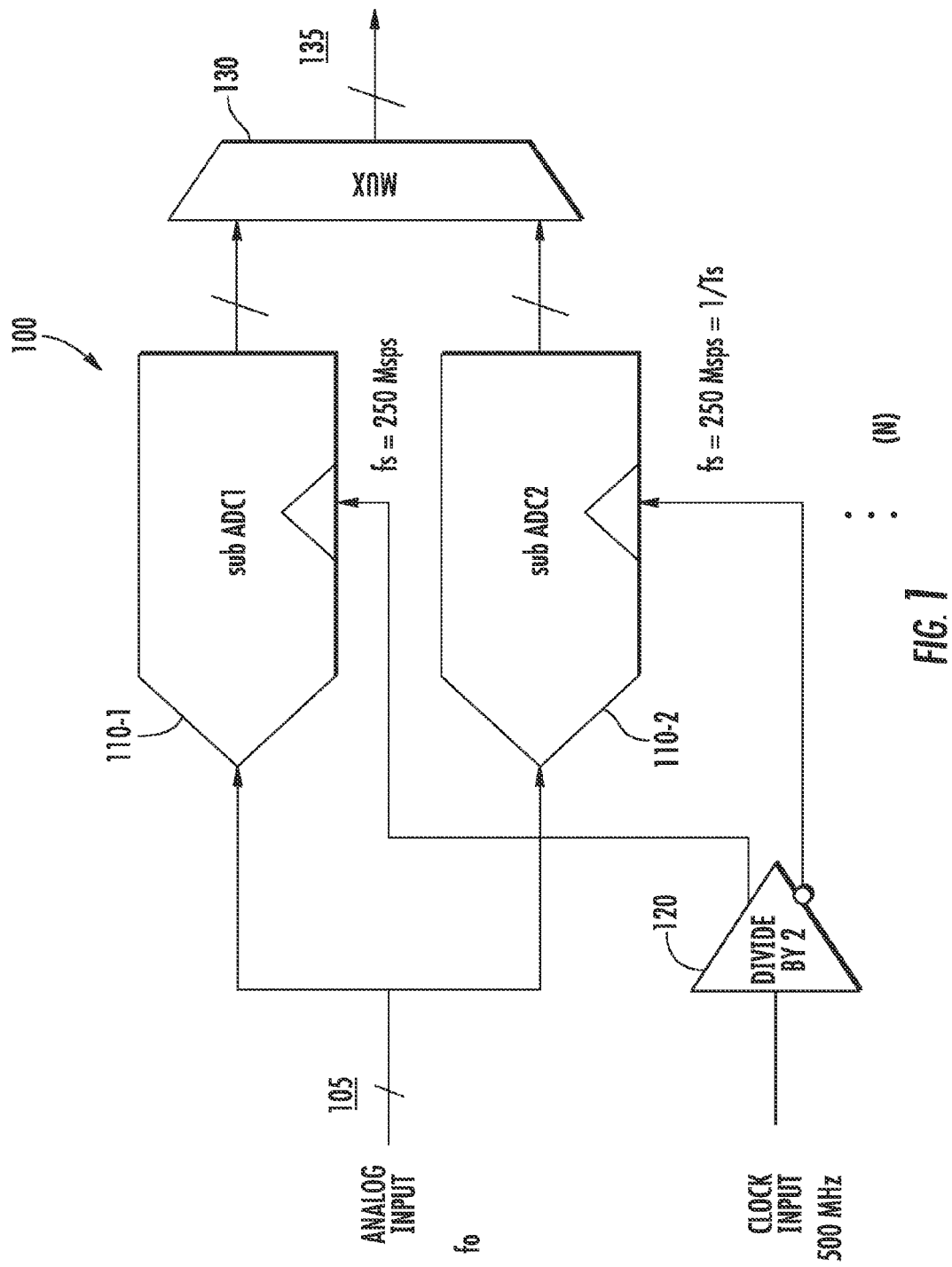
FIG. 1 is a high level block diagram of a two channel Time Interleaved Analog to Digital Converter (TIADC).

A Time Interleaved Analog to Digital Converter (TIADC) apparatus 100 is shown in FIG. 1. The TIADC apparatus 100 shown is a two-channel device, and thus consists of a pair of subADCs (subADC 1 and subADC 2), each clocked at one-half the effective output sample rate. In this example, each subADC 110 is operated at a sample rate, fs, of 250 MHz to achieve a 500 MHz output sample rate. Clock signals that are 180° out of phase with each other are generated by clock circuit 120 and fed to a respective subADC 110. A digital multiplexer 130 combines the outputs of the subADCs 110 to produce the digitized output signal 135.

The example shown in FIG. 1 can be generalized to using a number, N, of subADCs. Suppose each of the N subADCs samples at a frequency fs, and that the samples taken by the subADCs are spaced apart by a time equal to 1/(N*fs). Then, if the digital outputs of the N subADCs are interleaved together properly by multiplexer 135, the input signal is also properly sampled, and the output samples are properly converted to digital values, at a combined sample rate of Fs=N*fs. In this way a higher equivalent sampling rate can be obtained by an N-channel ADC apparatus 100.

In a preferred embodiment, the subADCs may each be successive approximation, charge-domain, pipelined ADC cores such as those described in U.S. patent application Ser. No. 12/074,706 by Anthony, et al., and U.S. Pat. No. 7,079,067 also by Anthony et al., each of which are also incorporated herein by reference in their entirety. Briefly, in that type of ADC core, first and second pipeline stages incorporate charge-redistribution, charge-comparison, and charge-redistribution-driver circuits to provide multiple bits of analog-to-digital conversion. However, other types of subADCs 110 may be used.

FIGS. 2A and 2B are time domain and frequency domain plots of the signals sampled by the two subADCs in the TIADC of FIG. 1. As shown in FIG. 2A, time samples are taken evenly spaced in time with a period Ts/2=1/fs, i.e., two times the original sampling rate of fs. When the operating conditions and components are ideal, corresponding ideal sampling of the input is achieved by the interleaved ADCs, and no spectral lines or spurs occur around the original sampling frequency fs, i.e., at 250 MHz.

Figure 3B:
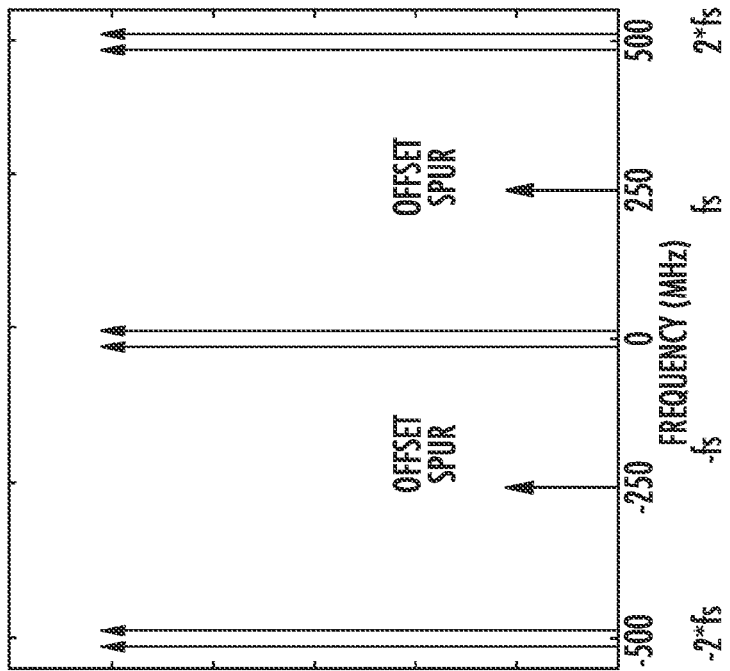
FIGS. 3A and 3B illustrate a sampled input signal with a DC offset between the two subADCs and the resulting frequency domain.
Figure 3A:
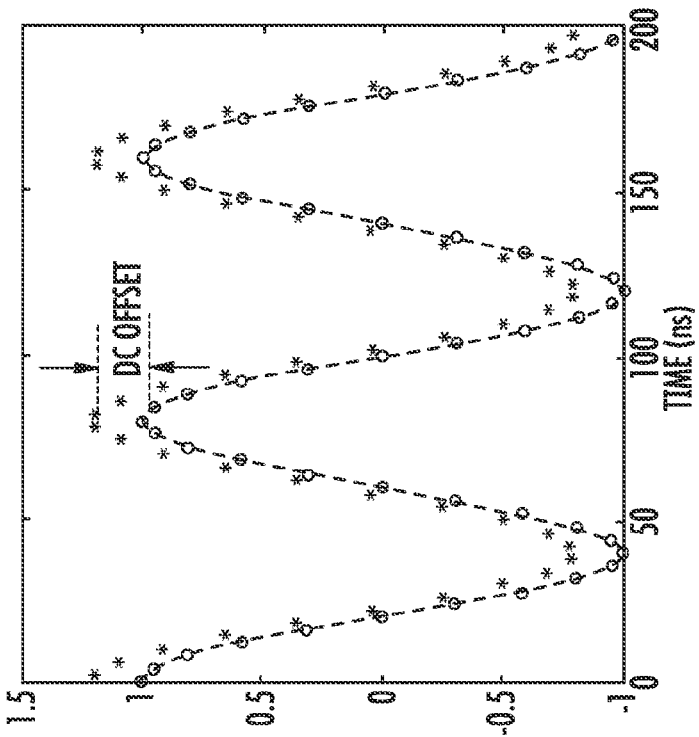

FIGS. 3A and 3B show a more realistic situation where the effect of offset errors are introduced by the subADCs. In particular, a DC offset is introduced between the samples taken by the first subADC 110-1 (indicated by the "*"s) and the second subADC 110-2 (indicated by the "o"'s). This DC offset generates a square wave at fs, that is, it produces a spur at the Nyquist frequency of the interleaved subADC.

In cases where N>2, additional spurs will also occur mid-band.

Figure 4:
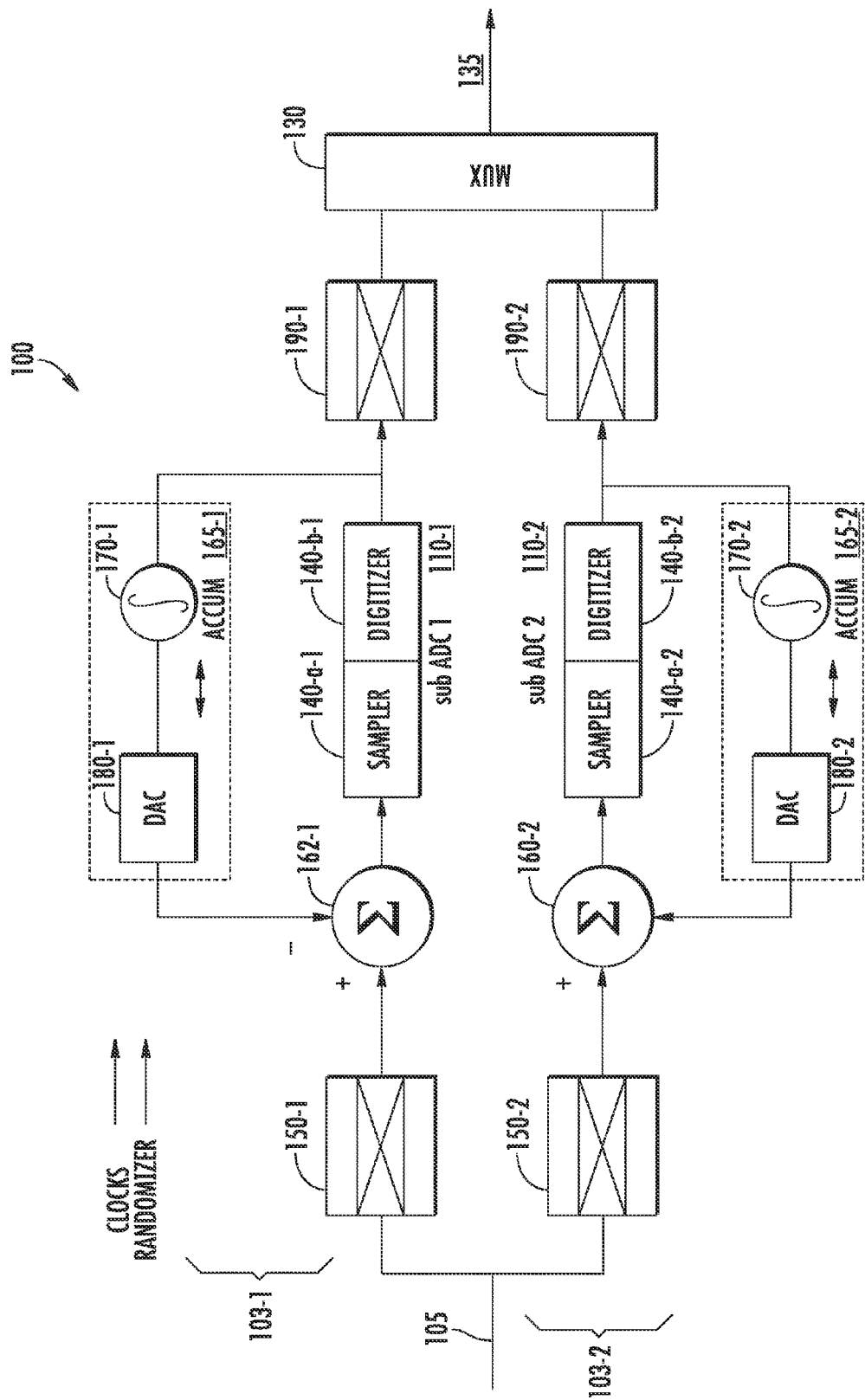
FIG. 4 is a block diagram of a preferred implementation to correct offset in each subADC.

An approach to fixing the problem of offset spurs is shown in the diagram of FIG. 4. Here, the offset is estimated from the digital output for each subADC 110. But the offset correction is made to the analog voltage input to each subADC, at some point before it is fully digitized. In this case, the rate at which the offset estimate is corrected is chosen and/or adjusted to keep pace with its expected rate of change.

As with the implementation of FIG. 1, the FIG. 4 TIADC 100 consists of a pair of subADCs 110-1 and 110-2 each operating at one-half the desired output sample rate. As before, the input analog signal 105 is split into two paths and fed to each of the two channels 103-1 and 103-2. But here, a first channel 103-1 consists of a number of signal processing components including an analog chopper 150-1, an analog signal combiner (e.g., a summer or difference amplifier) 160-1, a subADC 110-1 (which itself consists of a sampler 140a-1 and digitizer 140b-1), a digital reverse chopper 190-1, and an accumulator 165-1 including an integrator 170-1 and a Digital to Analog converter (DAC) 180-1. The second channel 103-2 similarly consists of chopper 150-2, analog combiner 160-2, subADC 110-2 including sampler 140a-2 and digitizer 140b-2, accumulator 165-2 including integrator 170-2 and DAC 180-2, and digital reverse chopper 190-2. Finally, multiplexer 130 combines the outputs of the two channels as digital output signal 135.

The analog input choppers 150-1 and 150-2 provide pseudo-random switching of the polarity of the analog input to each subADC 110 before sampling 140a and digitizing 140b. The polarity switching process produces an analog signal for a respective digitizer 150-1, 150-2 with zero mean. The analog choppers 150 are driven by appropriate pseudo-random signal generators (not shown for clarity and well known in the art) at a clock rate that is the same as the respective sample rate, fs, of each channel 103. Thus, in the example shown, the analog choppers 150 operate at a rate of 250 MHz. While the choppers 150 may be considered to be optional, if the choppers 150 are not used, the input signal 105 must typically have a zero mean in order for the remainder of circuit 100 to operate consistently.

The combiners 160 receive an analog feedback signal from the offset measurement components and remove any DC offset. This corrected analog signal is fed to the input of a respective subADC 110. The offset adjustment implemented by combiners 160 may be made at the input to the sampler 140-a as a pure analog subtraction operation (as illustrated in FIG. 4), but may also be implemented in other ways within portions of subADC 110.

Thus, the analog correction can be made to the input of sampler 140-a, within a sampler 140-a itself, or to the analog voltages within digitizer 140-b. What is important is that it is implemented as an analog domain correction at the input stage of each subADC.

Sampler 140-a provides a sample of the corrected analog signal to each digitizer 140-b. Digitizer 140-b then provides the ADC conversion result provided for each respective subADC 110.

The M digital output bits from each channel are then subjected to a digital reverse chopper 190. The reverse chopper 190, operating in synchronization with (but time-delayed from) the input chopper 150 for the channel, undoes any input polarity change. The time delay between the input chopper 150 and output reverse chopper 190 is needed to compensate for the ADC processing time of the channel components.

The corrected digital samples are then fed to multiplexer 130 for output as ADC output 135.

The accumulators 165 each include an integrator 170 and DAC 180. In one embodiment shown accumulators 165 may accumulate the digital samples output by the respective digitizer 140-b for an extended period of time. In terms of determining the desired integration time, what matters is typically that the most significant bit or bits of the result have settled. The integration time depends on the rate at which the subADCs 110 are expected to drift with respect to one another. If, for example, one intends to correct drifts introduced by 1/f noise, the integration time needs to be short. However, if correction is to be made for drift over temperature, the integration time can be much longer. What matters is that the two respective subADCs 110 introduce the same offset, so that when their outputs are combined by multiplexer 130 any spurious content at the Nyquist frequency is reduced (and in cases where N>2, spurs at mid band as well).

The DACs 180 can be relatively low speed, needing only to operate at the offset correction rate. They can, for example, be implemented as resistor string DACs or other simple DAC architectures as long as they provide a monotonic output result. In some embodiments, for example, the offset result may only be a single bit.

In other embodiments (as indicated by the dashed arrow), the same result can be achieved with the accumulator 170 and DAC reversed in order—that is, the DAC 180 may receive the signal from a corresponding digitizer 110 and the integrator 170 may be an analog integrator.

The approach of FIG. 4 adjusts the offset in the analog domain rather than in the digital domain. This approach provides the advantage of averaging a large number of M-bit digital samples, so that the accuracy of the offset measurement increases as the square root of the number of samples averaged.

But unlike prior approaches, the digit estimate of the offset is then used to adjust each subADC in the analog domain. In this way, the offset of each subADC can be driven much closer to zero than the one-bit uncertainty of any digital correction of the prior art. This reduces the noise of the equivalent ADC 100 to essentially that of each subADC 110. This offset correction process can be carried out in the "background", that is, while the ADC apparatus is in active use.

The correction of relative offsets in the analog domain can achieve higher precision than digital correction, reducing spurious tones while adding no additional noise to the digital output.

While this invention has been particularly shown and described with references to example embodiments thereof, it will be understood by those skilled in the art that various changes in form and details may be made therein without departing from the scope of the invention encompassed by the appended claims.

What is claimed is:

1. A method for correcting an offset error in a time-interleaved analog to digital converter (TIADC) comprising:

a first step of sampling an analog input signal to provide a first sampled analog signal;

a second step of sampling the analog input signal to provide a second sampled analog signal, with samples of the second step of sampling taken at different times than samples of the first step of sampling;

digitizing the first sampled analog signal to provide a first digitized signal;

digitizing the second sampled analog signal to provide a second digitized signal;

estimating a Direct Current (DC) offset error from at least one of the first and second digitized signals; and prior to completion of at least one of the first or second sampling steps or one of first or second digitizing steps, adjusting an analog signal to compensate for the DC offset error.

2. The method of claim 1 wherein estimating step is performed for each of the first and second digitized signals.

3. The method of claim 1 wherein the adjusting step adjusts an analog signal.

4. The method of claim 1 wherein the adjusting step adjusts one of the first or second sampled analog signals.

5. The method of claim 1 wherein the adjusting step adjusts an analog signal generated during one of the first or second digitizing steps.

6. The method of claim 1 wherein the step of estimating additionally comprises:

integrating at least one of the first or second digitized signals, to produce an averaged digital signal.

7. The method of claim 6 additionally comprising, between the step of estimating and adjusting, converting a digital DC offset error estimate derived from the averaged digital signal to an analog DC offset error estimate signal.

8. The method of claim 1 additionally comprising:

pseudo-randomly changing a polarity of the analog input signal.

9. The method of claim 8 wherein the step of pseudo-randomly changing the polarity of the analog input signal is performed at a rate related to a sampling rate used in at least one of the sampling steps.

10. The method of claim 8 additionally comprising:

pseudo-randoming changing the polarity of the digitized signal, to reverse the step of pseudo-randomly changing the polarity of the analog input signal.

11. A time-interleaved analog to digital converter (TIADC) apparatus comprising:

a first sampler, for providing a first sampled analog signal from an input analog signal;

a second sampler, for providing a second sampled analog signal from the input analog signal;

a first digitizer, operating on the sampled analog signal to produce a first digitized signal having M bits of resolution;

a second digitizer, operating on the sampled analog signal to produce a second digitized signal having M bits of resolution;

an accumulator, for accumulating samples of at least one of the first or second digitized signals, to produce a digital Direct Current (DC) offset error signal;

a digital to analog converter, for converting the digital DC offset error signal, to produce an analog DC offset error signal; and a combiner, disposed prior to, or within, at least one of the sampler or digitizer, for combining the analog DC offset error signal with an analog signal to compensate for offset error in the TIADC apparatus.

12. The apparatus of claim 11 additionally wherein:

an accumulator and a combiner arranged to process each of the first and second digitized signals.

13. The apparatus of claim 11 wherein the combiner operates on the analog input signal.

14. The apparatus of claim 11 wherein the combiner operates on the sampled analog signal.

15. The apparatus of claim 11 wherein the combiner operates on an analog signal generated within the digitizer.

16. The apparatus of claim 11 wherein the accumulator produces an averaged digital signal to be used as the digital DC offset error signal.

17. The apparatus of claim 11 additionally comprising:

an input signal analog chopper, for pseudo-randomly changing a polarity of the analog input signal.

18. The apparatus of claim 17 wherein input signal analog chopper pseudo-randomly changing the polarity of the analog input signal at a rate related to a sampling rate used by the sampler.

19. The apparatus of claim 17 additionally comprising:

an output signal digital chopper, for pseudo-randoming changing a polarity of the digitized signal.

20. The apparatus of claim 19, additionally comprising:

a delay circuit, for adjusting a relative delay in the operation of the input signal analog chopper and output signal digital chopper, to compensate for operations by the sampler and digitizer.

21. The apparatus of claim 11 wherein the accumulator further comprises:

a digital integrator, for accumulating samples of one of the first or second digitized signals, to produce the digital DC offset error signal.

22. The apparatus of claim 11 wherein the accumulator further comprises:

a second digital to analog converter, for converting one of the first or second digitized signals, to produce an analog converter output signal; and an analog integrator, for accumulating samples of the analog converter output signal, to produce the analog DC offset error signal.

* * * * *

UNITED STATES PATENT AND TRADEMARK OFFICE
CERTIFICATE OF CORRECTION

| | | |
|---|---|---|
| PATENT NO. | : 8,269,657 B2 | Page 1 of 1 |
| APPLICATION NO. | : 12/818762 | |
| DATED | : September 18, 2012 | |
| INVENTOR(S) | : Anthony et al. | |

It is certified that error appears in the above-identified patent and that said Letters Patent is hereby corrected as shown below:

Col. 2, line 21 should read "frequency domain ~~to~~ result when there is no offset in sub-"

Signed and Sealed this
Thirteenth Day of November, 2012

David J. Kappos
*Director of the United States Patent and Trademark Office*